United States Patent [19]

Peters

[11] Patent Number: 4,800,002

[45] Date of Patent: Jan. 24, 1989

[54] METHOD OF MAKING A DIAMOND HEAT SINK

[75] Inventor: Josephus A. M. Peters, Vortum-Mullem, Netherlands

[73] Assignee: Drukker International B.V., Sh Cuyk, Netherlands

[21] Appl. No.: 170,540

[22] Filed: Mar. 21, 1988

[30] Foreign Application Priority Data

Mar. 23, 1987 [NL] Netherlands ........................ 8700673

[51] Int. Cl.⁴ .......................... C25D 5/02; C25D 5/54
[52] U.S. Cl. ...................................... 204/15; 204/16; 204/38.1; 204/38.4; 204/38.5
[58] Field of Search ................. 204/15, 16, 38.1, 38.4, 204/38.5

[56] References Cited

U.S. PATENT DOCUMENTS 4,595,603  6/1986  Davies ................................ 427/214

Primary Examiner—T. M. Tufariello
Attorney, Agent, or Firm—Kane, Dalsimer, Sullivan, Kurucz, Levy, Eisele and Richard

[57] ABSTRACT

A diamond heat sink is made by metalizing at least one diamond and attaching the metalized diamond to a base plate and coating the exposed surfaces of the diamond and the base plate with a metallic layer. To do this a thin solder metal layer is first applied in the contact surface between the diamond and the base plate and the diamond is attached to the base plate by supplying heat through the diamond to the contact surface between the diamond and the base plate. Thereafter the base plate is removed from the diamonds to obtain the diamond heat sink composed of the diamond and the metallic layer.

10 Claims, 1 Drawing Sheet

METHOD OF MAKING A DIAMOND HEAT SINK

The invention relates to a method of making a diamond heat sink, wherein at least one diamond is metalized, the metalized diamond is attached to a base plate and the exposed surfaces of the diamond and the base plate are coated with a metallic layer, whereafter the base plate is removed from the diamond to obtain the diamond heat sink composed of the diamond and the metallic layer.

Such a method is known from U.S. Pat. No. 4,425,195. According to this known method the metalized diamond is attached to the base plate by means of a layer of wax applied to the base plate. By heating the diamond and the layer of wax, the layer of wax melts and the diamond sinks into the wax. After cooling, the diamond is bonded to the base plate. This way of attaching the diamond to the base plate has as a result that the surface of the diamond heat sink which is subsequently obtained shows an irregularity at the location of the diamond/metal transition, which is a disadvantage for its application with high frequency chip components, such as Gunn-, impatt- and trapatt-diodes.

U.S. Pat. No. 4,595,603 discloses a method of the same type, in which the diamond is not metalized until the diamond is attached to the base plate. Attaching the unmetalized diamond to the base plate will also have the result in this known method tat the surface of the subsequently obtained diamond heat sink shows irregularities at the location of the diamond/metal transition.

The invention aims to provide a method of the above mentioned kind, wherein said disadvantage is obviated in a simple but nevertheless effective manner.

To this end the method according to the invention a thin solder metal layer is applied in the contact surface between the diamond and the base plate and the diamond is attached to the base plate by supplying heat through the diamond to the contact surface between the diamond and the base plate.

In this manner one obtains a diamond that is only attached to the base plate in the contact surface between the diamond and the base plate, whereby the surface of the subsequently obtained diamond heat sink (after the usual treatment thereof) is perfectly flat and shows no irregularities at the location of the diamond/metal transition.

According to the invention the diamond is preferably attached by means of a bonding tool, the end of which is provided with a diamond contact plate.

The invention will be further explained by reference to the drawings in which some steps of an embodiment of the method according to the invention are schematically shown.

Figure 4:
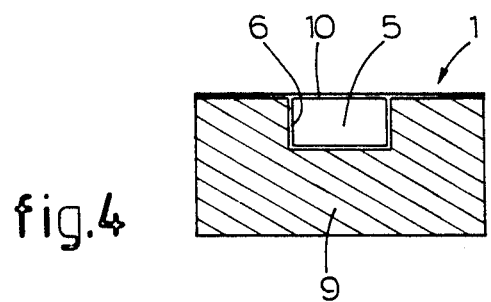
FIG. 4 is a schematic section on a larger scale of a diamond heat sink obtained in this way.

Referring to the drawings there is schematically shown a number of steps of a method for making a diamond heat sink indicated in FIG. 4 with reference number 1.

Figure 1:
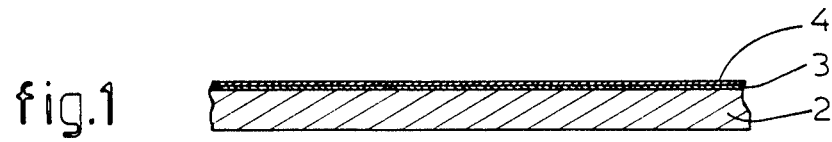
FIG. 1 is a cross-section of a part of a base plate to which the diamonds are to be attached.

For making such a diamond heat sink 1, there is used a base plate 2 partly shown in FIG. 1, which base plate is provided with an electroless nickel layer 3 after a treatment with a zincate. A thin tin layer 4 is applied on the nickel layer by electroplating until a fine white-grey layer is obtained. The thickness of the tin layer preferably amounts to about 1 $\mu$m. Applying the tin layer by electroplating preferably takes place at a temperature of about 30° C. during an electroplating time of about 5 minutes at a current density of about 1.5 A/cm$^2$.

Figure 2:
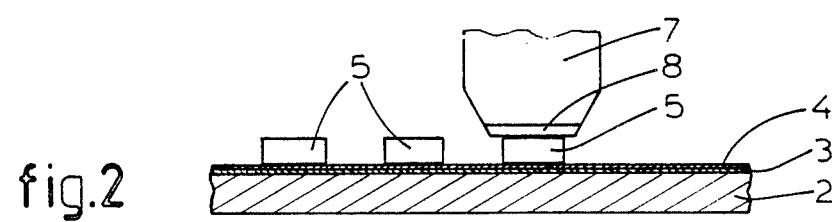
FIG. 2 shows the base plate of FIG. 1, to which a plurality of diamonds are attached.
Figure 3:
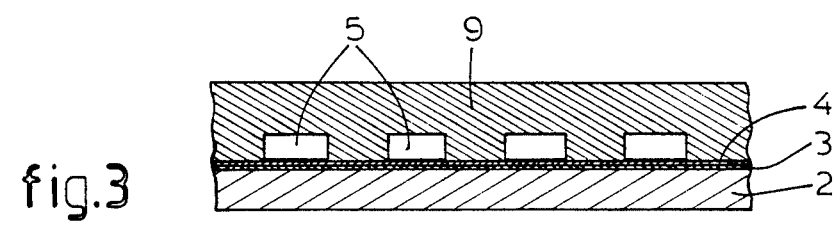
FIG. 3 shows the base plate with the attached diamonds and the applied metallic layer.

As shown in FIG. 2, diamonds 5 are attached to the base plate 2 provided with the nickel layer 3 and the tin layer 4. These diamonds 5 are first metalized, for example with titanium, platinum and gold applied in sequence. This metallisation is indicated by reference number 6 in FIG. 4. Attaching a diamond 5 on the base plate 2 takes place by means of a bonding tool, the head 7 of which is partly shown in FIG. 2 and which is provided with a contact plate 8 consisting of diamond. Thereby heat is applied only at the location of the contact surface between the diamond 5 and the base plate 2, so that only at the location of this contact surface will the thin tin layer 4 form a connection between the diamond 5 and the base plate 2. By this local heating of the thin tin layer 4 the risk that material of the in layer 4 can come on the vertical surfaces of the diamond 5 around its circumference is avoided.

After a cleaning treatment, the base plate with the diamonds 5 is subsequently electrolytically provided with a nickel separation layer (not shown), whereafter a copper layer 9 is electrolytically applied to the whole.

The heat sinks 1 are separated from each other by removing the intermediate copper by milling or the like and subsequently, the base plate 2 is removed, for example by chemical dissolution. If desired, one heat sink 1 may have two or more diamonds 5. Of course, it is also possible to remove the base plate 2 first and thereafter separate the heat sinks 1 from each other.

The upper side of the heat sink 1 is cleaned by lapping, whereafter a nickel layer is applied by electroplating and the whole is coated subsequently with titanium, platinum and gold, which is indicated in FIG. 4 by reference number 10.

It is essential for the method described that the diamond 5 is attached to the base plate 2 by a very local heating of the tin layer 4 so that no roughness arises at the circumference of the diamond. Thereby one obtains a heat sink with a perfectly flat upper surface, which is of significant importance for good operation of a chip operating at very high frequencies, when this chip is subsequently attached to the diamond 5.

Although it is stated in the above that the diamond 5 is provided with a titanium, platinum, gold metallisation, it is also possible to use other metals. Further, instead of a tin layer 4 another solder metal layer which is compatible with the outer layer of the metallisation 6 of the diamond 5 could be used.

Finally it is noted that the solder metal layer can also be applied to one of the surfaces of the diamond 5 instead of on the base plate 2.

Therefore, the invention is not restricted to the above described embodiment but can be varied in a number of ways within the scope of the invention.

I claim:

1. Method of making a diamond heat sink, wherein at least one diamond is metalized, the metalized diamond is attached to a base plate and the exposed surfaces of the diamond and the base plate are coated with a metallic layer, whereafter the base plate is removed from the diamond to obtain the diamond heat sink composed of the diamond and the metallic layer, wherein a thin solder metal layer is applied in the contact surface between the diamond and the base plate and the diamond is attached to the base plate by supplying heat through the diamond to the contact surface between the diamond and the base plate.

2. Method according to claim 1, wherein at least the side of the base plate to which the diamond will be attached is coated with the thin solder metal layer.

3. Method according to claim 1, wherein the diamond is attached by means of a bonding tool, the end of which is provided with a diamond contact plate.

4. Method according to claim 2, wherein the base plate is first coated with a nickel layer, whereafter a thin tin layer is applied on the nickel layer.

5. Method according to claim 4, wherein the tin layer has a thickness of about 1 μm.

6. Method according to claim 4, wherein the tin layer is provided by electroplating at a temperature of about 30° C. during an electroplating time of about 5 minutes and a current density of about 1.5 A/cm$^2$.

7. Method according to claim 3, wherein the bonding tool has a temperature of about 320° C.

8. Method according to claim 1, wherein before the application of the metallic layer, a thin separation layer is applied to prevent direct contact of the metallic layer with the metalized diamond.

9. Method according to claim 1, wherein the surface of the diamond heat sink containing the diamond, is coated with a titanium-platinum- gold layer by sputtering.

10. Diamond heat sink obtained by the method according to claim 1.

* * * * *